United States Patent
Avraham et al.

(10) Patent No.: US 11,449,236 B2
(45) Date of Patent: Sep. 20, 2022

(54) DATA STORAGE DEVICE WITH SYNDROME WEIGHT MINIMIZATION FOR DATA ALIGNMENT

(71) Applicant: Western Digital Technologies, Inc., San Jose, CA (US)

(72) Inventors: David Avraham, Even Yehuda (IL); Omer Fainzilber, Herzliya (IL); Mark Shlick, Ganey-Tikva (IL); Yoav Markus, Tel-Aviv (IL)

(73) Assignee: Western Digital Technologies, Inc., San Jose, CA (US)

( * ) Notice: Subject to any disclaimer, the term of this patent is extended or adjusted under 35 U.S.C. 154(b) by 223 days.

(21) Appl. No.: 16/864,257

(22) Filed: May 1, 2020

(65) Prior Publication Data
US 2021/0342095 A1    Nov. 4, 2021

(51) Int. Cl.
*G06F 3/06* (2006.01)
*H03M 13/37* (2006.01)

(52) U.S. Cl.
CPC .......... *G06F 3/0619* (2013.01); *G06F 3/0659* (2013.01); *H03M 13/37* (2013.01)

(58) Field of Classification Search
CPC .............................. H03M 13/37; G06F 3/0659
See application file for complete search history.

(56) References Cited

U.S. PATENT DOCUMENTS

| | | | | |
|---|---|---|---|---|
| 4,357,702 A | * | 11/1982 | Chase | G11B 20/20 |
| 8,181,084 B1 | * | 5/2012 | Chaichanavong | H03M 13/293 |
| | | | | 714/758 |
| 8,935,600 B1 | * | 1/2015 | Varnica | H03M 13/2957 |
| | | | | 714/790 |
| 2009/0106626 A1 | * | 4/2009 | Hou | H03M 13/1197 |
| | | | | 714/E11.017 |
| 2017/0257118 A1 | * | 9/2017 | Goldenberg | H03M 13/1105 |
| 2017/0271031 A1 | * | 9/2017 | Sharon | G06F 11/3058 |
| 2018/0173422 A1 | * | 6/2018 | Pierson | G06F 3/0604 |
| 2020/0252079 A1 | * | 8/2020 | Wang | H03M 13/1125 |

* cited by examiner

*Primary Examiner* — William E. Baughman
*Assistant Examiner* — Janice M. Girouard
(74) *Attorney, Agent, or Firm* — Michael Best & Friedrich LLP

(57) ABSTRACT

A memory controller that includes, in one implementation, a memory interface and a controller circuit. The memory interface is configured to interface with a non-volatile memory. The controller circuit is configured to receive a skewed codeword read from the non-volatile memory. The controller circuit is also configured to scan the skewed codeword by inserting or removing a quantity of bits at different locations in the skewed codeword and determining resulting syndrome weights of the skewed codeword. The controller circuit is further configured to determine an adjusted codeword by inserting or removing the quantity of bits at one of the different locations in the skewed codeword which results in a smallest syndrome weight. The controller circuit is also configured to decode the adjusted codeword.

16 Claims, 4 Drawing Sheets

DATA STORAGE DEVICE WITH SYNDROME WEIGHT MINIMIZATION FOR DATA ALIGNMENT

BACKGROUND

This application relates generally to memory devices, and more particularly, to a controller in a memory device that performs data alignment.

The size of an error correction code ("ECC") word is predefined and strictly structured. Thus, small changes in an ECC word (for example, inserting or removing even a single bit) cause a misalignment that renders the ECC word undecodable. Data misalignment may occur in various parts of a data storage device's life. For example, data misalignment may occur in pre-controller phases where the memory might be approached in bypass modes and may suffer from various alignment problems. Further, data misalignment may occur due to other various reasons (for example, malfunctions in bad column replacements, issues in ROM, BUS errors, NAND errors, etc).

SUMMARY

Undecodable data can be turned into decodable data by locating and correcting data misalignments. Previous conventional approaches require the data to have a very specific content structure. The present disclosure includes devices, methods, and apparatuses to locate and correct data misalignments by minimizing syndrome weight. The devices, methods, and apparatuses described herein are agnostic to the content of the data and, thus are suitable to locate and correct data misalignments in both structured and unstructured data.

The present disclosure provides a memory controller including, in one implementation, a memory interface and a controller circuit. The memory interface is configured to interface with a non-volatile memory. The controller circuit is configured to receive a skewed codeword read from the non-volatile memory. The controller circuit is also configured to scan the skewed codeword by inserting or removing a quantity of bits at different locations in the skewed codeword and determining resulting syndrome weights of the skewed codeword. The controller circuit is further configured to determine an adjusted codeword by inserting or removing the quantity of bits at one of the different locations in the skewed codeword which results in a smallest syndrome weight. The controller circuit is also configured to decode the adjusted codeword.

The present disclosure also provides a method includes receiving, with a controller circuit, a skewed codeword read from a non-volatile memory. The method also includes scanning, with the controller circuit, the skewed codeword by inserting or removing a quantity of bits at different locations in the skewed codeword and determining resulting syndrome weights of the skewed codeword. The method further includes determining, with the controller circuit, an adjusted codeword by inserting or removing the quantity of bits at one of the different locations in the skewed codeword which results in a smallest syndrome weight. The method also includes decoding, with the controller circuit, the adjusted codeword.

The present disclosure also provides an apparatus including, in one implementation, means for interfacing with a non-volatile memory, means for receiving a skewed codeword read from the non-volatile memory, means for scanning the skewed codeword by inserting or removing a quantity of bits at different locations in the skewed codeword and determining resulting syndrome weights of the skewed codeword, means for determining an adjusted codeword by inserting or removing the quantity of bits at one of the different locations in the skewed codeword which results in a smallest syndrome weight, and means for decoding the adjusted codeword.

In this manner, various aspects of the present disclosure provide for improvements in at least the technical fields of memory devices and their design and architecture. The present disclosure can be embodied in various forms, including hardware or circuits controlled by computer-implemented methods, computer program products, computer systems and networks, user interfaces, and application programming interfaces; as well as hardware-implemented methods, signal processing circuits, memory arrays, application specific integrated circuits, field programmable gate arrays, and the like. The foregoing summary is intended solely to give a general idea of various aspects of the present disclosure and does not limit the scope of the present disclosure in any way.

DETAILED DESCRIPTION

In the following description, numerous details are set forth, such as data storage device configurations, controller operations, and the like, in order to provide an understanding of one or more aspects of the present disclosure. It will be readily apparent to one skilled in the art that these specific details are merely exemplary and not intended to limit the scope of this application. In particular, the functions associated with the controller circuit and ECC engine may be performed by hardware (for example, analog or digital circuits), a combination of hardware and software (for example, program code or firmware stored in a non-transitory computer-readable medium that is executed by processing on control circuitry), or any other suitable means. The following description is intended solely to give a general idea of various aspects of the present disclosure and does not limit the scope of the disclosure in any way.

Figure 1:
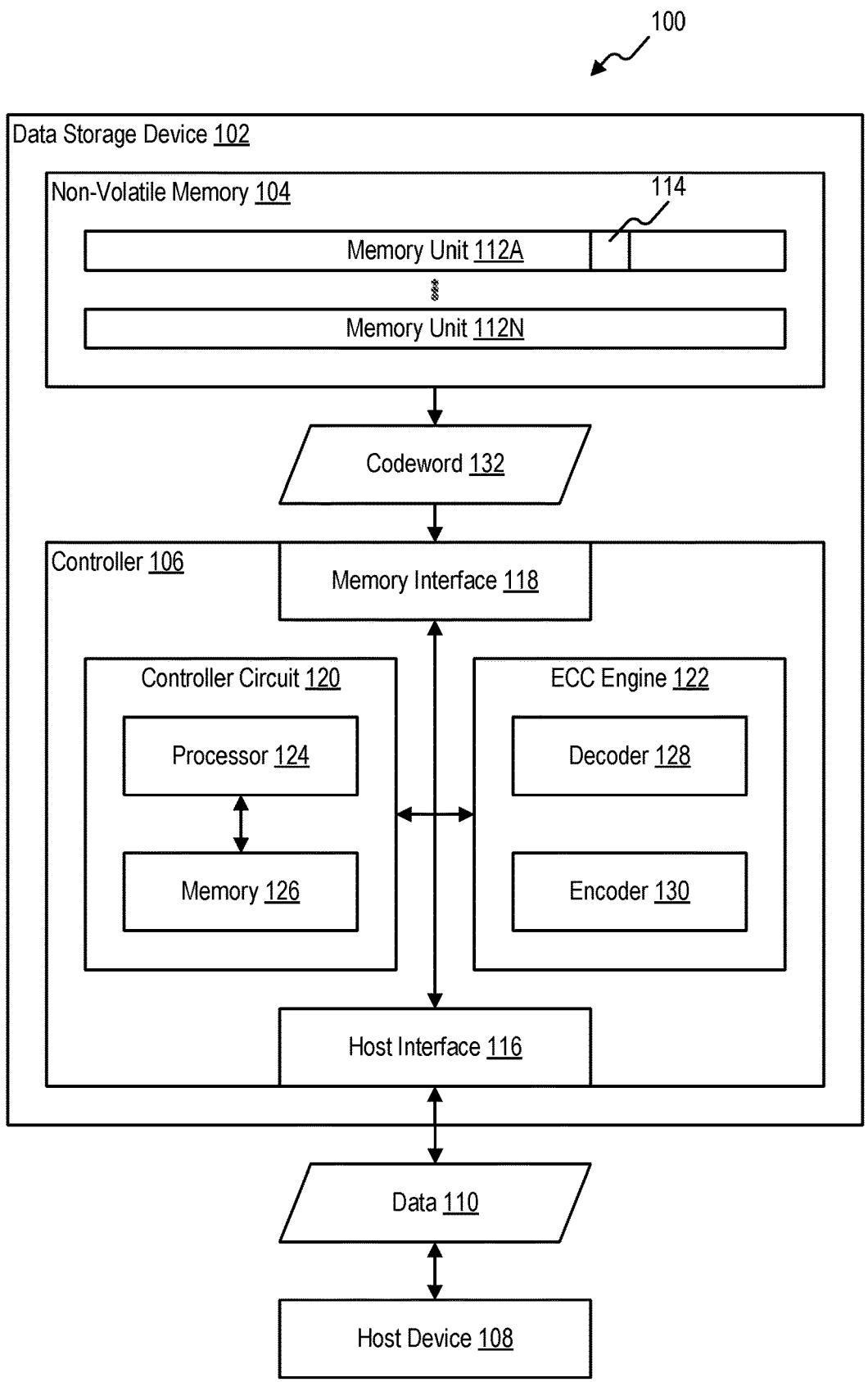
FIG. 1 is block diagram of one example of a system including a data storage device, in accordance with some implementations of the present disclosure.

FIG. 1 is block diagram of one example of a system 100 that includes a data storage device 102. In some implementations, the data storage device 102 is a flash memory device. For example, the data storage device 102 is a Secure Digital SD® card, a microSD® card, or another similar type of data storage device. The data storage device 102 illustrated in FIG. 1 includes a non-volatile memory 104 and a controller 106. The data storage device 102 is coupled to a host device 108. The host device 108 is configured to provide data 110 (for example, user data) to the data storage device 102 to be stored, for example, in the non-volatile memory 104. The host device 108 is also configured to request data 110 to be read from the non-volatile memory 104. The host device 108 is, for example, a smart phone, a music player, a video player, a gaming console, an e-book reader, a personal digital assistance, a tablet, a notebook computer, or another similar device.

The non-volatile memory 104 of the data storage device 102 is coupled to the controller 106. In some implementations, the non-volatile memory 104 is NAND flash memory. The non-volatile memory 104 illustrated in FIG. 1 includes a plurality of memory units 112A-112N (for example, flash memory units). Each of the plurality of memory units 112A-112N includes a plurality of storage elements. For example, in FIG. 1, the memory unit 112A includes a representative storage element 114. In some implementations, the storage element 114 is a multi-level cell ("MLC") flash memory cell, such as a four bits per cell ("4BPC") flash memory cell. In other implementations, the storage element 114 is a single level cell ("SLC") flash memory cell, a two bits per cell ("2BPC") flash memory cell, a three bits per cell ("3BPC") flash memory cell, or a flash memory cell having a larger number of bits per cell (for example, between five and ten bits per cell). In some implementations, the plurality of memory units 112A-112N are included in a word line or page of an MLC flash memory. In other implementations, the plurality of memory units 112A-112N are spread across multiple word lines or pages of an MLC flash memory.

The controller 106 illustrated in FIG. 1 includes a host interface 116, a memory interface 118, a controller circuit 120, and an ECC engine 122. The controller 106 is illustrated in FIG. 1 in a simplified form. One skilled in the art would recognize that a controller for a non-volatile memory would include additional modules or components other than those specifically illustrated in FIG. 1. Additionally, although the data storage device 102 is illustrated in FIG. 1 as including the controller 106 and modules for performing, for example, ECC, in other implementations, the controller 106 is instead located within the host device 108 or is otherwise separate from the data storage device 102. As a result, ECC and other flash translation layer ("FTL") operations that would normally be performed by the controller 106 (for example, wear leveling, bad block management, data scrambling, garbage collection, address mapping, etc.) can be performed by the host device 108 or another device that connects to the data storage device 102.

The controller 106 is configured to send data to, and receive data and instructions from, the host device 108 via the host interface 116. The host interface 116 enables the host device 108 to, for example, read from the non-volatile memory 104 and to write to the non-volatile memory 104 using any suitable communication protocol. Suitable communication protocols include, for example, the Universal Flash Storage ("UFS") Host Controller Interface specification, the Secure Digital ("SD") Host Controller specification, etc.

The controller 106 is also configured to send data and commands to, and receive data from, the non-volatile memory 104 via the memory interface 118. As an illustrative example, the controller 106 is configured to send data and a write command to instruct the non-volatile memory 104 to store data in a particular memory location in the non-volatile memory 104. The controller 106 is also configured to send a read command to the non-volatile memory 104 to read data from a particular memory location in the non-volatile memory 104.

The controller circuit 120 illustrated in FIG. 1 includes an processor 124 (for example, a microprocessor, a microcontroller, a field-programmable gate array ["FPGA"] semiconductor, an application specific integrated circuit ["ASIC"], or another suitable programmable device) and a non-transitory computer readable medium or memory 126 (for example, including random access memory ["RAM"] and read only memory ["ROM"]). The processor 124 is operatively connected to the various modules within the controller circuit 120, the controller 106, and the data storage device 102. For example, firmware is loaded in a ROM of the memory 126 as computer executable instructions. Those computer executable instructions are capable of being retrieved from the memory 126 and executed by the processor 124 to control the operation of the controller circuit 120 and perform the processes described herein (for example, data alignment and ECC). In some implementations, one or more modules of the controller circuit 120 correspond to separate hardware components within the controller circuit 120. In other implementations, one or more modules of the controller circuit 120 correspond to software stored within the memory 126 and executed by the processor 124. The memory 126 is configured to store data used by the controller circuit 120 during operation.

The ECC engine 122 is configured to receive data to be stored in the non-volatile memory 104. The ECC engine 122 is configured to encode data using an ECC encoding scheme. In some implementations, the ECC encoding scheme is a Reed Solomon encoding scheme, a Bose-Chaudhuri-Hocquenghem ("BCH") encoding scheme, a low-density parity check ("LDPC") encoding scheme, or another suitable encoding scheme. The ECC engine 122 illustrated in FIG. 1 includes a decoder 128 and an encoder 130. The decoder 128 is configured to decode data that is read from the non-volatile memory 104. For example, the decoder 128 is configured to decode a codeword 132 read from the non-volatile memory 104. The decoder 128 is configured to detect and correct bit errors that are present in the data read from the non-volatile memory 104. The decoder 128 corrects bit errors present in the data read from the non-volatile memory 104 up to an error correction capability of the implemented ECC scheme. In some implementations, the ECC engine 122 is included in the controller circuit 120.

Figure 2:
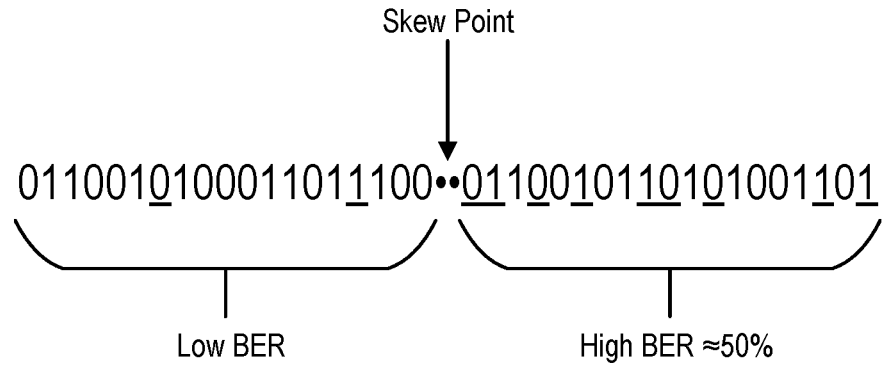
FIG. 2 is diagram of one example of a data misalignment in a skewed codeword, in accordance with some implementations of the present disclosure.

Bit errors that originate, for example, from hardware malfunction such as bus errors, NAND errors, various problems in bad column replacements mechanism or ROM fuse, may cause error patterns that are impossible to decode. Shifting the data by even one bit will create a fundamentally different ECC word from a decoder perspective. In practice, a skewed codeword will have a bit error rate ("BER") of up to 50%. FIG. 2 is one example of a skewed codeword. In FIG. 2, locations of bit errors are identified by underlining. As illustrated in FIG. 2, the data up until the skew point has a low BER. However, the data after the skew point in FIG. 2 is not aligned and becomes a different codeword with a high BER (for example, about 50% errors). Returning the data to its original location will immediately turn the data into a valid representation.

Every codeword has a set of parity-check equations that define the constrains of the code. For a specific codeword, the number of unsatisfied parity-check equations is defined as the syndrome weight. A legal codeword is a codeword where all the parity-check equations are satisfied and therefore, the syndrome weight is zero. For a codeword with several bit flips, some of the parity-check equations are not satisfied and the corresponding syndrome weight is larger than zero. There is a correlation between the number of bit flips in a codeword and the syndrome weight of the codeword. High syndrome weight corresponds to a high number of bit flips while low syndrome weight corresponds to a low number of bit flips. Thus, the syndrome weight provides an indication if manipulations on a specific codeword are useful or not. As illustrated in FIG. 2, a skewed codeword has a very large syndrome weight because the skewed data induces a lot of bit flips. Inserting or removing the bits that caused the skew will decrease the syndrome weight of the adjusted codeword. Further, decreasing the syndrome weight of the codeword below a decoding threshold of an ECC decoder (for example, decoder 128) will make the codeword decodable.

Figure 3:
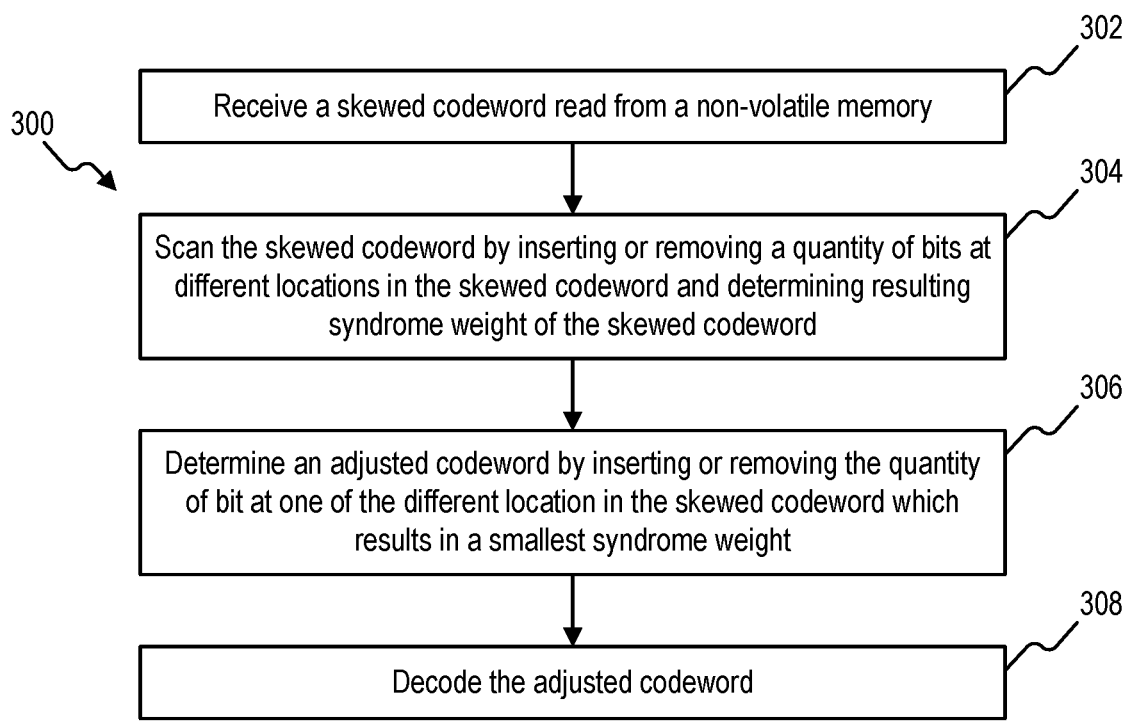
FIG. 3 is a flow diagram of an example of a method for syndrome weight minimization of a skewed codeword, in accordance with some implementations of the present disclosure.

FIG. 3 is a flow diagram of one example of a method 300 for syndrome weight minimization of a skewed codeword. At block 302, a skewed codeword read from the non-volatile memory 104 is received. For example, the controller circuit 120 may send a read request to the non-volatile memory 104 and responsively receive the skewed codeword. At block 304, the skewed codeword is scanned by inserting or removing a quantity of bits at different locations in the skewed codeword and determining resulting syndrome weights of the skewed codeword. Different implementations of scanning the skewed codeword is described in detail further below. At block 306, an adjusted codeword is determined by inserting or removing the quantity of bits at one of the different locations in the skewed codeword which results in a smallest syndrome weight. As described above, inserting or removing the bits that caused a skew in a skewed codeword will decrease the syndrome weight of the codeword. Thus, the controller circuit 120 can determine the location of the skew point in the skewed codeword as the scanned location which resulted in the smallest syndrome weight. At block 308, the adjusted codeword is decoded. In some implementations, the controller circuit 120 decodes the adjusted codeword internally. For example, the ECC engine 122 may be included in the controller circuit 120. In other implementations, the controller circuit 120 decodes the adjusted codeword by sending the adjusted codeword to the ECC engine 122 for decoding by the decoder 128.

Figure 4:
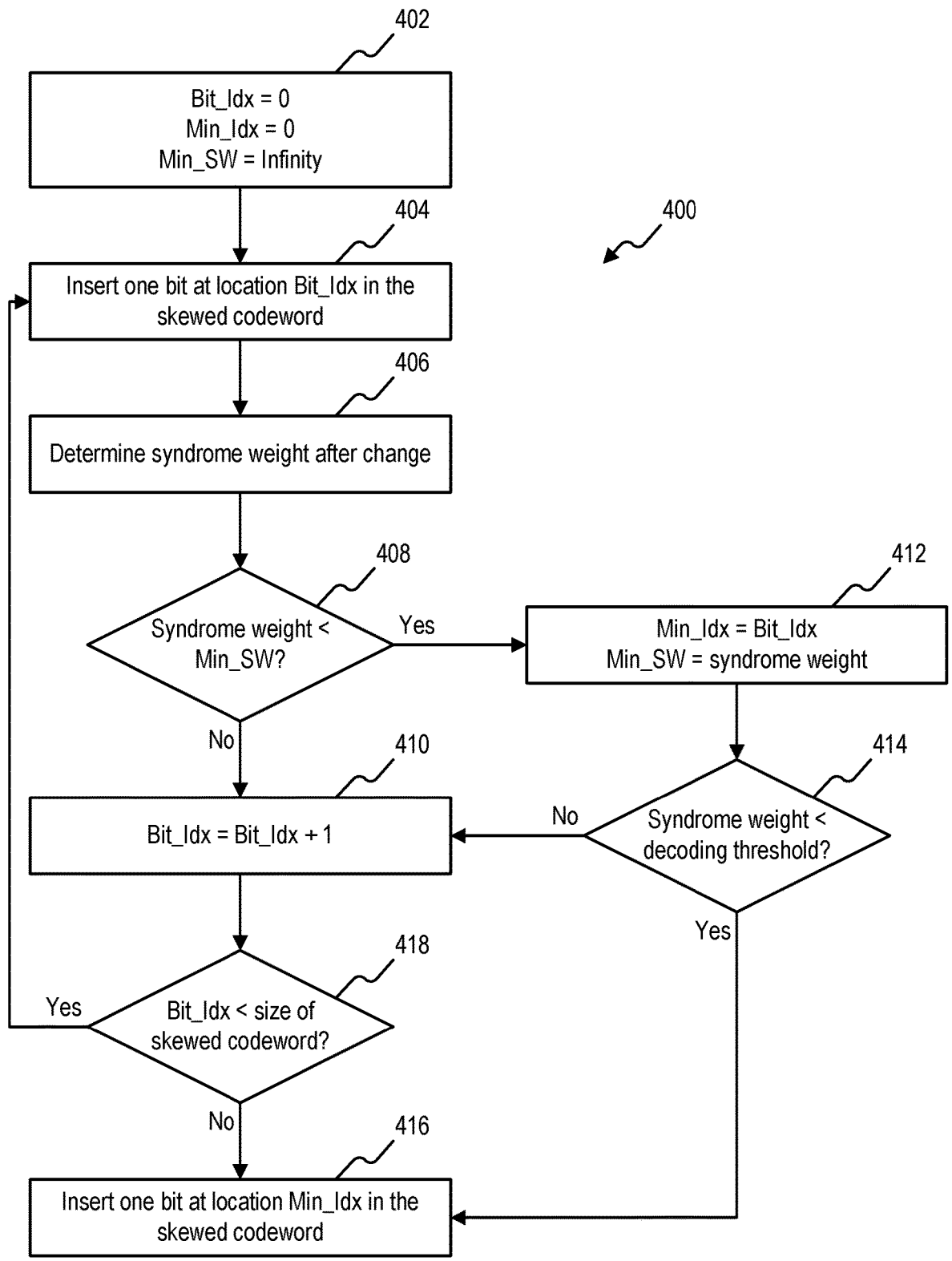
FIG. 4 is a flow diagram of an example of a method for locating and correcting a skew point in a skewed codeword by syndrome weight minimization, in accordance with some implementations of the present disclosure.

FIG. 4 is a flow diagram of one example of a method 400 for locating and correcting a skew point in a skewed codeword by syndrome weight minimization. The method 400 described below is an example of one implementation in which a skewed codeword is scanned by inserting one bit in steps of one bit. In other implementations, as described in detail further below, a skewed codeword is scanned by inserting more than one bit in steps of one or more bits, removing one or more bits at steps of one or more bits, or a combination thereof.

At block 402, the controller circuit 120 initializes a plurality of variables. For example, as illustrated in FIG. 4, the controller circuit 120 sets a bit index ("Bit_Idx") equal to zero, a minimum index ("Min_Idx") equal to zero, and a minimum syndrome weight ("Min_SW") equal to infinity. At block 404, the controller circuit 120 inserts one bit at location Bit_Idx in the skewed codeword. At block 406, the controller circuit 120 determines the syndrome weight of the skewed codeword after the change made in block 404. At block 408, the controller circuit 120 determines whether the syndrome weight is less than the minimum syndrome weight ("Min_SW"). When the syndrome weight is greater than or equal to the minimum syndrome weight ("Min_SW"), the method 400 proceeds to block 410 which is described in detail further below. Alternatively, when the syndrome weight is less than the minimum syndrome weight ("Min_SW"), the method 400 proceeds to block 412.

At block 412, the minimum index ("Min_Idx") to set equal to the bit index ("Bit_Idx") and the minimum syndrome weight ("Min_SW") is set equal to the syndrome weight. At block 414, the controller circuit 120 determines whether the syndrome weight is less than a decoding threshold. The decoding threshold represents the maximum syndrome weight the codeword can have and still be decodable (for example, by the decoder 128). For example, a codeword with a syndrome weight at or above the decoding threshold cannot be decoded while a codeword with a syndrome weight below the decoding threshold can be decoded. In some implementations, the decoding threshold is (or is related to) the decoding threshold for the decoder 128 in the ECC engine 122. When the syndrome weight is less than the decoding threshold, the method 400 proceeds to block 416 which is described in detail further below. Alternatively, when the syndrome weight is greater than or equal to the decoding threshold, the method 400 proceeds to block 410.

At block 410, the controller circuit 120 increases the bit index ("Bit_Idx") by one. At block 418, the controller circuit 120 determines whether the bit index ("Bit_Idx") is less than the size of the skewed codeword. When the bit index ("Bit_Idx") is less than the size of the skewed codeword, the method 400 returns to block 404 to scan another location in the original skewed codeword. Note that each time the method 400 returns to block 404 from block 418, one bit is inserted at a new location in the original skewed codeword, not the altered codeword resulting from the previous iteration. Alternatively, when the bit index ("Bit_Idx") is equal to the size of the skewed codeword, each location in the skewed codeword has been scanned and the method 400 proceeds to block 416. At block 416, the controller circuit 120 inserts one bit at location Min_Idx in the skewed codeword. Upon reaching block 416, Min_Idx represents the location in the skewed codeword at which inserting one bit while result in the lowest syndrome weight as compared to the other locations that were scanned.

In some implementations, instead of inserting one bit at different locations in the skewed codeword as described above, the controller circuit 120 is configured to remove one bit from different locations in the skewed codeword. For example, the controller circuit 120 removes one bit at location Bit_Idx in the skewed codeword at block 404 and removes one bit at location Min_Idx in the skewed codeword at block 416. In some implementations, the controller circuit 120 is configured to both insert and remove one bit at different locations in the skewed codeword. For example, when the minimum syndrome weight of the skewed codeword (i.e., Min_SW) is still greater than the decoding threshold after one bit has been inserted at every location in the skewed codeword, the controller circuit 120 proceeds to remove one bit at every location in the skewed codeword.

In some implementations, the controller circuit 120 is configured to add more than one bit at different locations in the skewed codeword. For example, when the minimum syndrome weight of the skewed codeword (i.e., Min_SW) is still greater than the decoding threshold after one bit has been inserted at every location in the skewed codeword, the controller circuit 120 proceeds to insert two bits at every location in the skewed codeword.

In the method 400 described above, each location in the skewed codeword is scanned. Thus, in the method 400, the controller circuit 120 scans the skewed codeword in steps of one bit. In some implementations, the controller circuit 120 is configured to scan the skewed codeword in steps larger than one bit. For example, the controller circuit 120 may scan the skewed codeword in steps of four bits by scanning the first bit, the fifth bit, the ninth bit, etc.

Figure 5:
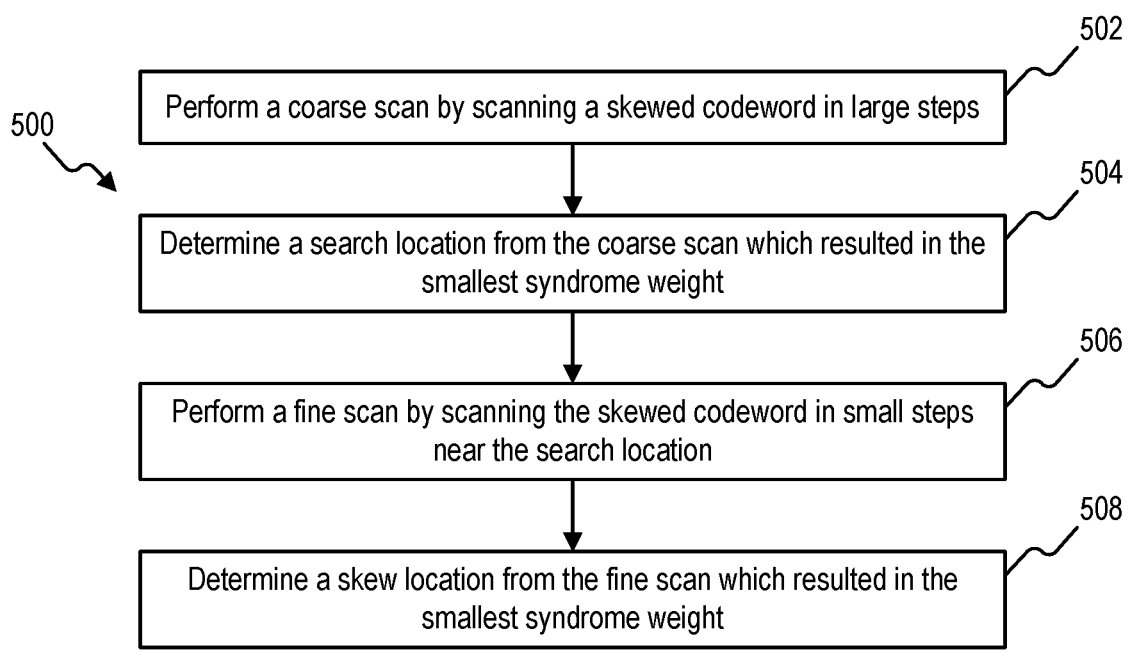
FIG. 5 is a flow diagram of an example of a method for scanning a skewed codeword with a coarse-fine search, in accordance with some implementations of the present disclosure.

In some implementations, the controller circuit 120 is configured to scan the skewed codeword in steps of different sizes. For example, in some implementations, the controller circuit 120 is configured to scan the skewed codeword with a coarse-fine search. FIG. 5 is a flow diagram of one example of a method 500 for scanning a skewed codeword with a coarse-fine search. At block 502, a coarse scan of the skewed codeword is performed by scanning a skewed codeword in large steps (i.e., steps that are larger than one bit). For example, the controller circuit 120 may scan different locations in the skewed codeword steps of four bits. At block 504, a search location from the coarse scan which resulted in the smallest syndrome weight is determined. For example, when five different locations in the skewed codeword are scanned during the coarse scan and the third scanned location resulted in the smallest syndrome weight, the determined search location is the third scanned location. At block 506, a fine scan of the skewed codeword is performed by scanning the skewed codeword in small steps near the search location. The small steps in block 506 (which are one example of "second-sized steps") are smaller than the large steps in block 502 (which are one example of "first-sized steps"). For example, the large steps are steps of four bits and the small steps are steps of one bit. In some implementations, the controller circuit 120 is configured to scan the skewed codeword in small steps near the search location until the resulting syndrome weight of the skewed codeword is below a decoding threshold. At block 508, a skew location from the fine scan which resulted in the smallest syndrome weight is determined. For example, when four different locations in the skewed codeword are scanned during the fine scan and the first scanned location resulted in the smallest syndrome weight, the determined skew location is the first scanned location. Applying a coarse-fine search, for example, as described above in the method 500, reduces the execution time of syndrome weight minimization because less locations are scanned to determine the smallest syndrome weight.

Inserting or remove bits from the skewed codeword at the search location determined from the coarse scan, as described above, results in an adjusted codeword with a syndrome weight that is smaller than the syndrome weight of the original codeword. The smaller syndrome weight of the adjusted codeword may be low enough such the adjusted codeword is decodable. If the adjusted codeword is decodable, no further scanning is need. Thus, in some implementations, prior to the performing the fine scan, the controller circuit 120 is configured to attempt to decode the adjusted codeword resulting from the coarse scan.

Figure 6:
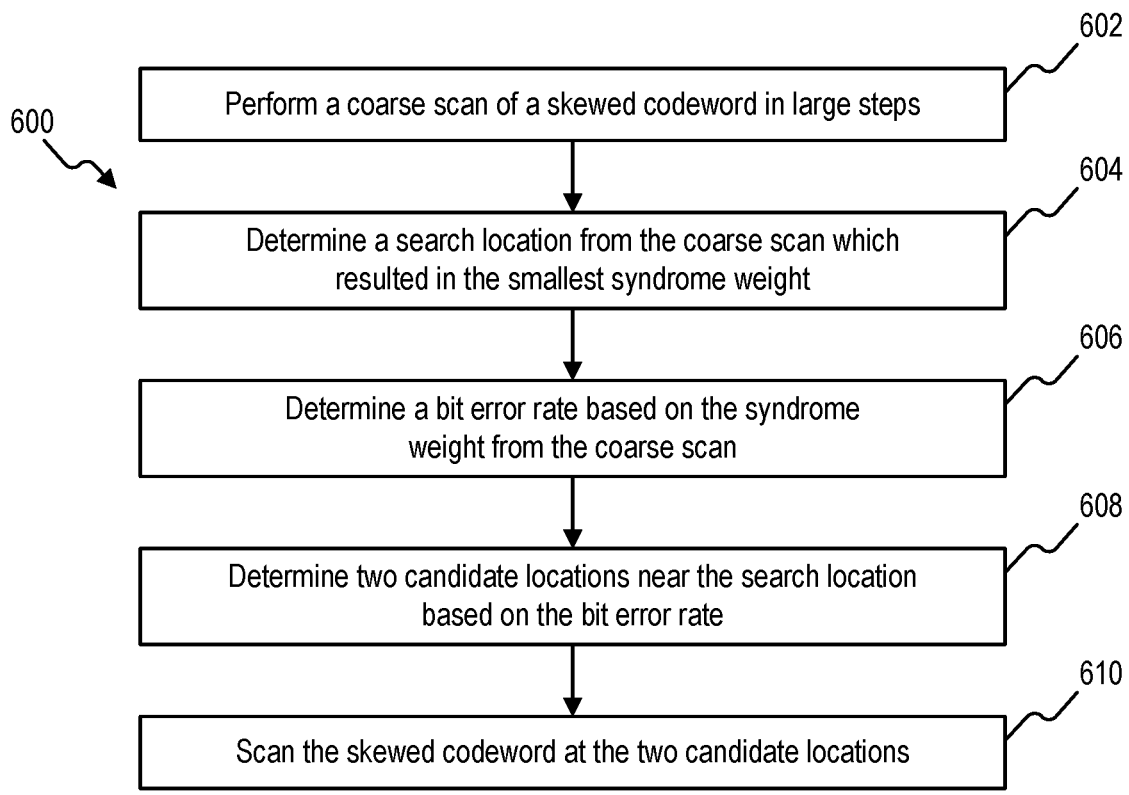
FIG. 6 is a flow diagram of an example of a method for scanning a skewed codeword based on a bit error rate ("BER") resulting from a coarse search, in accordance with some implementations of the present disclosure.

Further, the amount of errors in a codeword closely correspond to the value of syndrome weight when the syndrome weight is low. Thus, in some implementations, instead of performing a fine scan, the controller circuit 120 is configured to determine a bit error rate ("BER") based on the lowered syndrome weight resulting from the coarse scan. FIG. 6 is a flow diagram of one example of a method 600 for scanning a skewed codeword based on a BER resulting from a coarse scan. At block 602, a coarse scan of the skewed codeword is performed by scanning a skewed codeword in large steps (i.e., steps that are larger than one bit). For example, the controller circuit 120 performs a coarse scan of the skewed codeword as described above in relation to block 502 in method 500. At block 604, a search location from the coarse scan which resulted in the smallest syndrome weight is determined. For example, the controller circuit 120 determines a search location as described above in relation to block 504 in method 500. At block 606, a BER is determined based on the smallest syndrome weight from the coarse scan. As described above, there is a direct correlation between syndrome weight and BER, particularly for lower values of syndrome weight. Thus, due of the lower syndrome weight resulting from the coarse scan, the controller circuit 120 may determine the BER using the direct correlation between syndrome weight and BER. At block 608, two candidate locations near the search location are determined based on the BER. The amount of bit errors caused by a skew corresponds to the distance between the search location and the skew in the skewed codeword. For example, the distance between the search location and the skew is smaller when the skewed codeword has less bit errors, and the distance between the search location and the skew is larger when the skewed codeword has more bit errors. Thus, the controller circuit 120 may determine a distance between the search location and the skew point based on the BER determined for the syndrome weight of the search location. The controller circuit 120 may then use the determined distance to determine two candidate locations near the search location. For example, if a skewed codeword has 32 bit flips (and assuming the induced BER is 50%), then the location of the skew in the skewed codeword should be either 64 bits ahead or 64 bits before the search location. At block 610, the skewed codeword is scanned at the two candidate locations. For example, the controller circuit 120 scans the skewed codeword at the two candidate locations to determine which of the two candidate location results in the smallest syndrome weight. Using BER, for example, as described above in the method 600, reduces the execution time of syndrome weight minimization because only two locations are scanned after performing the coarse search.

In some cases, a skew in one memory unit results in a skew in following memory units at the same physical location in the non-volatile memory 104. For example, a skew of three bits in a first memory unit can result in a skew of three bits in a second memory unit that follows. Thus, in some implementations, the controller circuit 120 is configured to correct a skew in a memory unit based on a skew found in a preceding memory unit. In such cases, the skew is typically located at the beginning of the memory unit. Thus, in some implementations, after determining a first adjusted codeword for a first skewed codeword read from a first memory unit, the controller circuit 120 determines a second adjusted codeword for a second skewed codeword read from a second memory unit (that follows the first memory unit) by inserting (or removing) the same quantity of bits at a location of a most significant bit in the second skewed codeword as was inserted (or removed) from the first skewed codeword. As a first example, when the controller circuit 120 removes four bits from the first skewed codeword, the controller circuit 120 removes the four most significant bits from the second skewed codeword. As a second example, when the controller circuit 120 inserts three bits into the first skewed codeword, the controller circuit 120 inserts three bits at the location of the most significant bit in the second skewed codeword.

In connection with the disclosed implementations, an apparatus includes means for interfacing with a non-volatile memory. The means for interfacing may correspond, for example, to the memory interface 118. The apparatus also includes means for receiving a skewed codeword read from the non-volatile memory. The means for receiving a skewed codeword may correspond, for example, to the memory interface 118, the controller circuit 120, the ECC engine 122, or a combination thereof. The apparatus also includes means for scanning the skewed codeword by inserting or removing a quantity of bits at different locations in the skewed codeword and determining resulting syndrome weights of the skewed codeword. The means for scanning the skewed codeword may correspond, for example, to the controller circuit 120, the ECC engine 122, or a combination of the two. The apparatus also includes means for determining an adjusted codeword by inserting or removing the quantity of bits at one of the different locations in the skewed codeword which results in a smallest syndrome weight. The means for determining an adjusted codeword may correspond, for example, to the controller circuit 120, the ECC engine 122, or a combination of the two. The apparatus also includes means for decoding the adjusted codeword. The means for decoding the adjusted codeword may correspond, for example, to the controller circuit 120, the ECC engine 122, or a combination of the two.

In some implementations, the means for scanning the skewed codeword is configured to scan the skewed codeword until the resulting syndrome weight of the skewed codeword is below a decoding threshold. In some implementations, the means for scanning the skewed codeword is configured to scan the skewed codeword in first-sized steps that are larger than one bit, determine a search location in the skewed codeword as one of the different locations for the first-sized steps which results in the smallest syndrome weight, and scan the skewed codeword in second-sized steps near the search location until the resulting syndrome weight of the skewed codeword is below a decoding threshold. The above-noted second-sized steps are smaller than the above-noted first-sized steps. In some implementations, the means for scanning the skewed codeword is configured to scan the skewed codeword in first-sized steps that are larger than one bit, determine a search location in the skewed codeword as one of the different locations for the first-sized steps which results in the smallest syndrome weight, determine a bit error rate based on the smallest syndrome weight, determine two candidate locations near the search location based on the bit error rate, and scan the skewed codeword at the two candidate locations.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain implementations and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A memory controller, comprising:
   a memory interface configured to interface with a non-volatile memory; and
   a controller circuit configured to:
      receive a skewed codeword read from the non-volatile memory,
      scan the skewed codeword by inserting or removing a quantity of bits at different locations in the skewed codeword and determining resulting syndrome weights of the skewed codeword,
      determine an adjusted codeword by inserting or removing the quantity of bits at one of the different locations in the skewed codeword which results in a smallest syndrome weight, and
      decode the adjusted codeword; and
   wherein, to scan the skewed codeword, the controller circuit is further configured to:
      scan the skewed codeword in first-sized steps that are larger than one bit,
      determine a search location in the skewed codeword as one of the different locations for the first-sized steps which results in the smallest syndrome weight, and
      scan the skewed codeword in second-sized steps near the search location until the resulting syndrome weight of the skewed codeword is below a decoding threshold, the second-sized steps being smaller than the first-sized steps.

2. The memory controller of claim 1, wherein, to scan the skewed codeword, the controller circuit is further configured to scan the skewed codeword until the resulting syndrome weight of the skewed codeword is below a decoding threshold.

3. The memory controller of claim 1, wherein, to scan the skewed codeword, the controller circuit is further configured to:
   determine a bit error rate based on the smallest syndrome weight, determine two candidate locations near the search location based on the bit error rate, and scan the skewed codeword at the two candidate locations.

4. The memory controller of claim 1, wherein the skewed codeword is a first skewed codeword read from a first memory unit of the non-volatile memory, wherein the adjusted codeword is a first adjusted codeword, and wherein the controller circuit is further configured to:

receive a second skewed codeword read from a second memory unit of the non-volatile memory, wherein the second memory unit follows the first memory unit, determine a second adjusted codeword by inserting or removing the quantity of bits at a location of a most significant bit in the second skewed codeword, and decode the second adjusted codeword.

5. The memory controller of claim 1, wherein the quantity of bits includes more than one bit.

6. The memory controller of claim 1, wherein, to scan the skewed codeword, the controller circuit is further configured to scan the skewed codeword in the second-sized steps of one bit.

7. A method, comprising:

receiving, with a controller circuit, a skewed codeword read from a non-volatile memory;

scanning, with the controller circuit, the skewed codeword by inserting or removing a quantity of bits at different locations in the skewed codeword and determining resulting syndrome weights of the skewed codeword;

determining, with the controller circuit, an adjusted codeword by inserting or removing the quantity of bits at one of the different locations in the skewed codeword which results in a smallest syndrome weight; and decoding, with the controller circuit, the adjusted codeword; and wherein the scanning the skewed codeword further includes:

scanning the skewed codeword in first-sized steps that are larger than one bit, determining a search location in the skewed codeword as one of the different locations for the first-sized steps which results in the smallest syndrome weight, determining a bit error rate based on the smallest syndrome weight, determining two candidate locations near the search location based on the bit error rate, and scanning the skewed codeword at the two candidate locations.

8. The method of claim 7, wherein the scanning the skewed codeword further includes scanning the skewed codeword until the resulting syndrome weight of the skewed codeword is below a decoding threshold.

9. The method of claim 7, wherein the scanning the skewed codeword further includes:

scanning the skewed codeword in second-sized steps near the search location until the resulting syndrome weight of the skewed codeword is below a decoding threshold, and wherein the second-sized steps are smaller than the first-sized steps.

10. The method of claim 7, wherein the skewed codeword is a first skewed codeword read from a first memory unit of the non-volatile memory, wherein the adjusted codeword is a first adjusted codeword, and wherein the method further comprises:

receiving, with the controller circuit, a second skewed codeword read from a second memory unit of the non-volatile memory, wherein the second memory unit follows the first memory unit;

determining, with the controller circuit, a second adjusted codeword by inserting or removing the quantity of bits at a location of a most significant bit in the second skewed codeword, and decoding, with the controller circuit, the second adjusted codeword.

11. The method of claim 7, wherein the quantity of bits includes more than one bit.

12. The method of claim 7, wherein the scanning the skewed codeword further includes scanning the skewed codeword in second-sized steps of one bit.

13. An apparatus, comprising:

means for interfacing with a non-volatile memory;

means for receiving a skewed codeword read from the non-volatile memory;

means for scanning the skewed codeword by inserting or removing a quantity of bits at different locations in the skewed codeword and determining resulting syndrome weights of the skewed codeword;

means for determining an adjusted codeword by inserting or removing the quantity of bits at one of the different locations in the skewed codeword which results in a smallest syndrome weight; and means for decoding the adjusted codeword; and wherein the means for scanning the skewed codeword is configured to:

scan the skewed codeword in first-sized steps that are larger than one bit, determine a search location in the skewed codeword as one of the different locations for the first-sized steps which results in the smallest syndrome weight, and scan the skewed codeword in second-sized steps near the search location until the resulting syndrome weight of the skewed codeword is below a decoding threshold, the second-sized steps being smaller than the first-sized steps.

14. The apparatus of claim 13, wherein the means for scanning the skewed codeword is configured to scan the skewed codeword until the resulting syndrome weight of the skewed codeword is below a decoding threshold.

15. The apparatus of claim 13, wherein the means for scanning the skewed codeword is configured to:

determine a bit error rate based on the smallest syndrome weight, determine two candidate locations near the search location based on the bit error rate, and scan the skewed codeword at the two candidate locations.

16. An apparatus, comprising:

means for interfacing with a non-volatile memory;

means for receiving a skewed codeword read from the non-volatile memory;

means for scanning the skewed codeword by inserting or removing a quantity of bits at different locations in the skewed codeword and determining resulting syndrome weights of the skewed codeword;

means for determining an adjusted codeword by inserting or removing the quantity of bits at one of the different locations in the skewed codeword which results in a smallest syndrome weight; and means for decoding the adjusted codeword; and wherein the means for scanning the skewed codeword is configured to:

scan the skewed codeword in first-sized steps that are larger than one bit, determine a search location in the skewed codeword as one of the different locations for the first-sized steps which results in the smallest syndrome weight,
determine a bit error rate based on the smallest syndrome weight,
determine two candidate locations near the search location based on the bit error rate, and
scan the skewed codeword at the two candidate locations.

* * * * *